(12) United States Patent
Ruhovets et al.

(10) Patent No.: US 7,020,757 B2
(45) Date of Patent: Mar. 28, 2006

(54) PROVIDING AN ARRANGEMENT OF MEMORY DEVICES TO ENABLE HIGH-SPEED DATA ACCESS

(75) Inventors: Michael Ruhovets, Tomball, TX (US); Christopher C. Wanner, Tomball, TX (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 341 days.

(21) Appl. No.: 10/400,371

(22) Filed: Mar. 27, 2003

(65) Prior Publication Data

US 2004/0193821 A1 Sep. 30, 2004

(51) Int. Cl.
*G06F 12/00* (2006.01)

(52) U.S. Cl. .................. 711/167; 711/5; 365/233; 365/230.03

(58) Field of Classification Search .............. 711/5, 711/127, 167; 365/230.03; 326/93–98; 709/208–209; 713/600
See application file for complete search history.

(56) References Cited

U.S. PATENT DOCUMENTS

| | | | |
|---|---|---|---|
| 6,040,743 A * | 3/2000 | Bjorklid et al. ........... 331/57 |
| 6,101,145 A * | 8/2000 | Nicholes ............ 365/230.01 |
| 6,317,352 B1 | 11/2001 | Halbert et al. |
| 6,493,250 B1 | 12/2002 | Halbert et al. |
| 6,502,161 B1 | 12/2002 | Perego et al. |
| 6,622,256 B1 * | 9/2003 | Dabral et al. ............ 713/600 |
| 6,861,868 B1 * | 3/2005 | Agrawal et al. ............ 326/38 |

OTHER PUBLICATIONS

Rambus Inc., "RDRAM® Memory: Leading Performance and Value over SDRAM and DDR," Document WP0001-R, Version 1.2, pp. 1-6, (Aug. 2001).
Rambus Inc., "RDRAM® Maximizing the Value of PCs and Workstations," Document WP0003-R, Version 1.0, pp. 1-5, (Aug. 2001).
Rambus Inc., "RIMM® Module (with 256/288Mb RDRAM®, Devices" Document DL0110, Version 1.1, pp. 1-12, (Mar. 2002).
Rambus Inc., "Direct Rambus™ Long Channel Design Guide", Document DL-0102-1.1, pp. 1-45, (2000).

\* cited by examiner

*Primary Examiner*—Nasser Moazzami

(57) ABSTRACT

A memory subsystem includes multiple memory modules coupled by point-to-point links. A memory controller is coupled by a point-to-point link to a first memory module, which is turn is coupled by another point-to-point link to another memory module. Further memory modules may be coupled by respective point-to-point links in the memory subsystem. In some arrangements, each memory module tracks commands issued to other memory modules, such as more upstream memory modules. Also, in one example implementation, a clock is embedded within a data stream transmitted over a point-to-point link, so that an external clock is not employed in this example implementation.

29 Claims, 3 Drawing Sheets

PROVIDING AN ARRANGEMENT OF MEMORY DEVICES TO ENABLE HIGH-SPEED DATA ACCESS

BACKGROUND

Memory devices are used to store information in various processing systems, such as computer systems, handheld devices, and other electronic devices or systems. The stored information is retrieved by microprocessors or microcontrollers to perform various tasks in the systems. With improved technology, the operating speeds of microprocessors and microcontrollers have increased dramatically, which has increased demand for faster and larger memory subsystems.

Memory devices are typically coupled to a memory bus. Traditionally, memory devices are coupled to the memory bus in a multi-drop arrangement, in which a group of signal lines (making up the memory bus) is connected to multiple memory devices at multiple points. Each connection point of a memory device(s) to the memory bus is referred to as a drop. Multiple connections thus correspond to multiple drops. Memory capacity can be added by adding more "drops"—that is, additional connection points of memory device(s) to the memory bus.

However, as more memory devices are added to a multi-drop memory bus, capacitive loading is increased that may slow down memory device operation. Also, the peak data rate on a multi-drop memory bus is reduced due to impedance mismatches associated with discontinuities on the multi-drop memory bus. Multi-drop memory buses also have other electrical characteristics that reduce memory bus performance.

DETAILED DESCRIPTION

In the following description, numerous details are set forth to provide an understanding of the present invention. However, it will be understood by those skilled in the art that the present invention may be practiced without these details and that numerous variations or modifications from the described embodiments may be possible.

Figure 1:
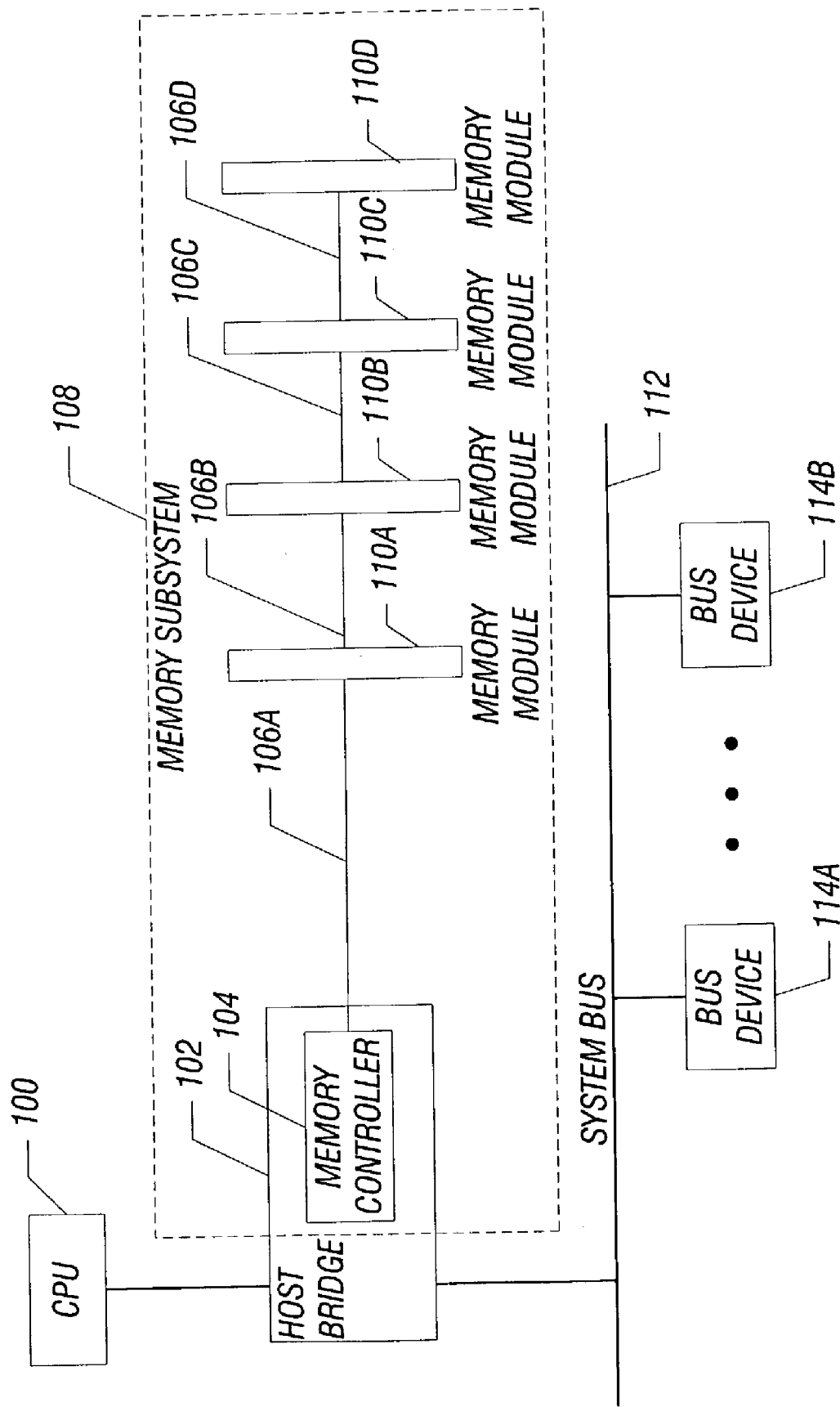
FIG. 1 is a block diagram of an example of a system that includes a memory subsystem according to some embodiments.

FIG. 1 is a block diagram of an example computer system that includes a memory subsystem 108 according to some embodiments. The memory subsystem 108 includes multiple memory modules 110A, 110B, 110C, and 110D. The memory modules 110A, 110B, 110C, and 110D are coupled by point-to-point links 106B, 106C and 106D. The memory module 110A is coupled by point-to-point link 106A to a memory controller 104.

A "point-to-point" link refers to any link that is coupled to two endpoints and that establishes communication of control and/or data information between the two endpoints. A point-to-point link is contrasted to a multi-drop link that can be connected to more than two points along the link. Each point-to-point link 106 can be a single-bit serial link (one bit in the transmit path and one bit in the receive path). To enhance bandwidth, the point-to-point link 106 can include multiple serial links arranged in parallel between each pair of endpoints.

In the context of the memory subsystem 108, a "memory bus" refers to the collection of point-to-point links 106. A "memory module" refers to a module that contains one or more memory devices.

The memory controller 104 in the example arrangement of FIG. 1 is part of a host bridge 102, which includes bridge circuitry that enables communication between a central processing unit (CPU) 100 and a system bus 112. The system bus 112 is coupled to bus devices 114A, 114B. In another example arrangement, the memory controller 104 can be a separate device that is outside the host bridge 102.

The arrangement shown in FIG. 1 is provided for purpose of example only. Other systems will have other arrangements. For example, in some systems, the CPU 100 may be connected directly to the system bus 112, rather than through a host bridge. Also, the number of memory modules shown in the memory subsystem 108 is provided as an example only. In other systems, a smaller or larger number of memory modules can be used in the memory subsystem 108.

Although not shown in FIG. 1, the set of memory modules 110A–110D along with the corresponding set of links 106A–106D can be repeated such that multiple sets of the memory modules 110 and links 106 are coupled in parallel to the memory controller 104. This provides even greater memory capacity.

In operation, the memory controller 104 sends a command over the link 106A to memory module 110A. The memory module 110A retransmits that command to the next memory module 110B, in addition to decoding the received command to determine whether the command is intended for the memory module 110A. Similarly, the memory module 110B retransmits the received command on towards the memory module 110C, which also decodes the received command to determine if the command is intended for memory module 110B. This is repeated with each successive memory module until the very last memory module (referred to as the most upstream module). In the arrangement of FIG. 1, the memory module 110A (the one closest to the memory controller 104) is referred to as the most downstream memory module, and the memory module 110D (the one furthest away from the memory controller 104) is referred to as the most upstream memory module.

Read data, responsive to read commands from the memory controller 104, are transmitted by the memory modules 110 back to the memory controller 104 in the reverse direction, with the read data passing through successive memory modules until the read data reaches the memory controller 102. Commands and data are sent in packets, with each packet referring to a group of characters, where each character includes data or command bits of predetermined size (e.g., 8 bits, 16 bits, etc.). Each packet is transmitted in a serial stream across a link 106. In one implementation, each packet has two or more characters.

Another feature of each point-to-point link 106, according to some embodiments, is that a clock is embedded within a stream of information bits communicated over the link 106. This provides a self-clocking feature. Self-clocking is achieved by using transitions within the information stream (transitions of successive bits in the stream between "0" and "1") as indications of clock edges. This is contrasted to providing a separate clock signal from the memory controller 104 to the memory modules 110. Thus, "embedding" a clock within a data or command information stream refers to using transitions of data or command bits (information bits) to define clock edges.

To ensure there in fact are information bit transitions in each transmitted character, encoding of the information in the character is performed so that there is at least one transition (usually more) within an encoded stream of information bits for all possible values of a character. For example, if an un-encoded character contains a series of all "0s" or "1s", then the un-encoded character will have no information bit transitions. However, in accordance with some embodiments of the invention, the character is provided through an encoding algorithm to provide an encoded character. Thus, a character of all "0s" or "1s" will be encoded to a value that is not all "0s" or "1s" so that information bit transitions occur within the encoded character.

In one implementation, an 8-bit character is encoded into a 10-bit character before transmission over a point-to-point link. At the receiving end, the encoded character is decoded back to its original 8-bit form. In other implementations, other types of encoding can be performed, so long as all possible values of an N-bit un-encoded character are encoded into respective groups of information bits that have one or more transitions between "0s" and "1s".

A benefit of using the point-to-point links 106 of the memory subsystem 108 according to some embodiments is that high capacitive loading (due to the presence of large numbers of devices on the link) and impedance mismatches (due to multiple discontinuities on a link) can be avoided. As a result, high-speed transmission over the links 106 is possible. Further, to add capacity to the memory subsystem 108, additional memory modules 110 can be added with corresponding point-to-point links. In other words, memory capacity can be expanded without adding capacitive or impedance loading to an existing memory link.

Another benefit offered by the memory subsystem 108 according to some embodiments is that, by embedding a clock within each information stream, rather than using a separate clock, re-synchronization of received data or command bits within the memory module 110 to an internal clock of the memory module is not needed. Re-synchronizing information bits to an internal clock adds extra synchronization latency on each retransmit, which reduces the speed of transmission over the links 106A–106D. With the memory subsystem 108 according to some embodiments, the only added latency for retransmit is the propagation delay through the receive and transmit buffers of each memory module and any logic in between.

Figure 2:
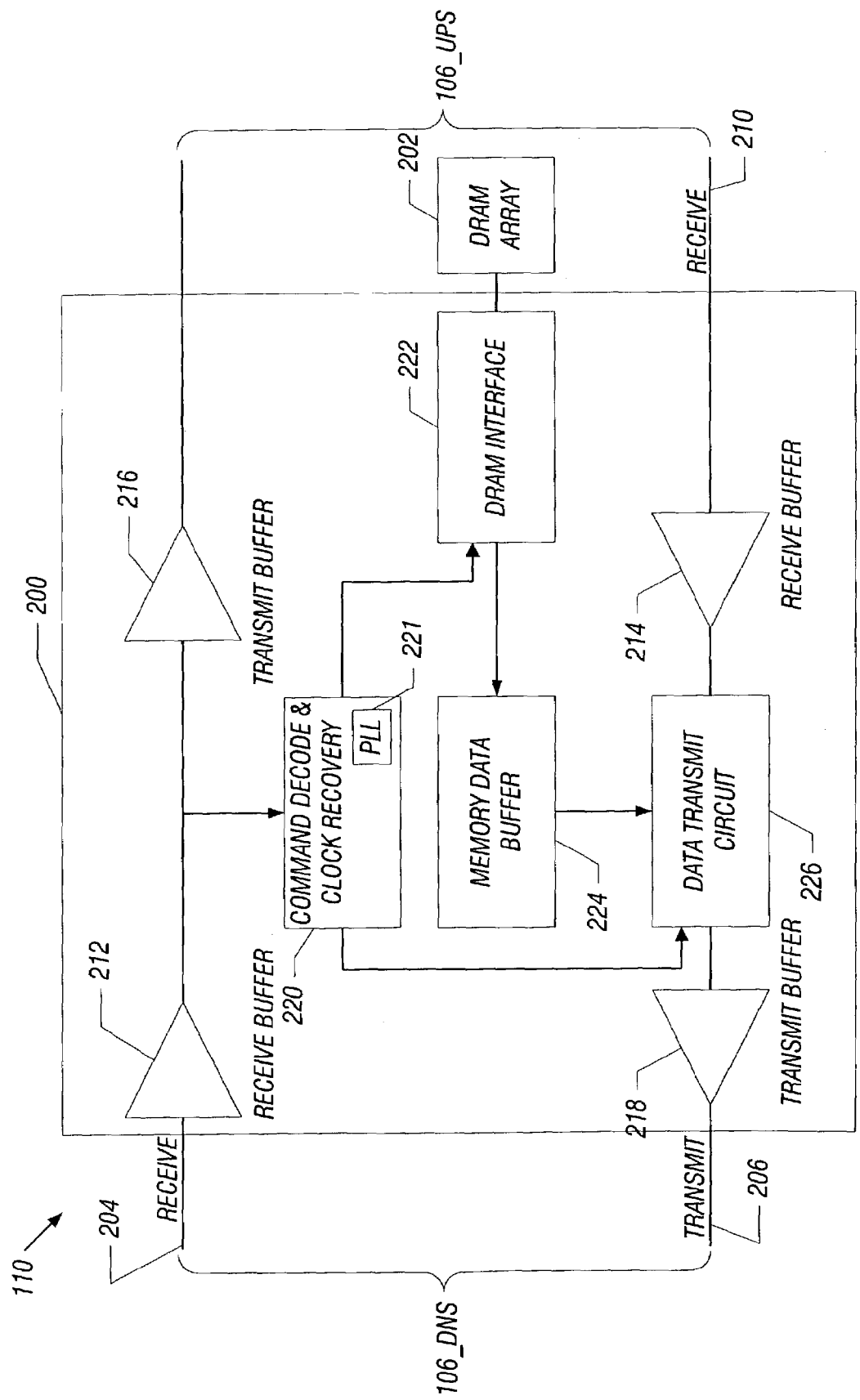
FIG. 2 is a block diagram of a memory buffer circuit used in the memory subsystem of FIG. 1.

Further according to one embodiment, packets from multiple memory modules can be sent back-to-back without requiring idle clocks in between, which enhances memory bandwidth and reduces latency FIG. 2 illustrates an example arrangement of a memory module 110. The memory module 110 includes a memory buffer circuit (according to an example implementation) 200 and one or more memory arrays 202. In one example implementation, the memory array 202 is a DRAM (dynamic random access memory) array, such as a synchronous DRAM (SDRAM) array. However, in other embodiments, other types of memory devices can be used, such as static RAMs (SRAMs) and so forth.

As shown in FIG. 2, each memory buffer circuit 200 is coupled to a downstream point-to-point link 106_DNS and to an upstream point-to-point link 106_UPS. The downstream link 106_DNS couples the memory buffer circuit 200 to a memory module or memory controller that is downstream of the memory buffer circuit 200, while the upstream link 106_UPS couples the memory buffer circuit 200 to a memory module that is upstream of the memory buffer circuit. Thus, for example, the memory buffer circuit 200 in the memory module 110A (FIG. 1) has a downstream link 106A and an upstream link 106B.

The downstream link 106_DNS has a receive path 204 and a transmit path 206. The receive path 204 receives commands and write data from the memory controller 104 (either directly over the link 106A or through the memory buffer circuits 200 of one or more other memory modules). The transmit path 206 sends read data back to the memory controller 104, either directly over link 106A or through memory buffer circuits of one or more other memory modules.

The upstream link 106_UPS also includes a transmit path 208 and a receive path 210. The transmit path 208 sends commands and write data to further memory modules, while the receive path 210 receives read data from upstream memory modules 110.

Note that the receive path 204 is a single-bit path over which a stream of serial data is received. An N-bit (e.g., N=8) stream of information bits (control or data bits) makes up a character. The other paths 206, 208, and 210 are similarly one-bit paths over which information bits are serially transmitted.

Within each memory buffer circuit 200, a receive buffer 212 receives information from the receive path 204, and a receive buffer 214 receives information from the receive path 210. A transmit buffer 216 transmits information out to the transmit path 208, and the transmit buffer 218 transmits information out to the transmit path 206.

Received information is provided to command decode and clock recovery logic 220, which is responsible for decoding commands received over the receive path 204. The command decode and clock recovery logic 220 determines if the received command is intended for the current memory module, or for another memory module. If the received command is intended for the current memory module, then appropriate command signals (and any write data) are sent from the command decode logic and clock recovery logic 220 to a memory interface 222 (e.g., DRAM interface). However, if the received commands are not intended for the current memory module, the command decode and clock recovery logic 220 makes a note of the command (read, write, read-modify-write, etc.). The command decode and clock recovery logic 220 tracks commands sent to upstream memory modules so that the memory buffer circuit 200 knows when to provide read data (assuming a read command was received by the command decode and clock recovery logic 220) in relation to read data provided by the upstream memory modules over the memory bus.

The clock recovery portion of the logic 220 includes a clock generator 221, such as a phase-locked loop (PLL) device. The clock generator 221 is synchronized to the embedded clock derived from streams of information bits received by the receive buffer 212. The clock generator 221 generates an internal clock that is provided to the DRAM interface 222.

Effectively, the DRAM interface 222 in each memory buffer circuit 200 operates on a clock derived from the command stream. This ensures that the DRAM interfaces on all memory modules use the same frequency clock and thus read data can be made available at the same time on each module relative to the command being received. Thus, a memory module that is further away (further upstream) from the memory controller 104 receives the command later and thus starts sending data back later than a memory module that is closer to the memory controller 104. The memory module that is furthest away (the most upstream memory module) uses the clock derived from the command stream to send the read data or fill data back downstream. This prevents a situation where a memory module that is more upstream starts sending data while a downstream memory module is not finished sending its own data.

The memory buffer circuit 200 also includes a data buffer 224 to store read data retrieved from the DRAM array 202 through the DRAM interface 222. Thus, if the command decode and clock recovery logic 220 receives a read command, the logic 220 causes the DRAM interface 222 to send appropriate read command and address signals to the DRAM array 202, which responds with read data. DRAM interface 222 provides the read data into the data buffer 224, with the data transmitted by a data transmit circuit 226 through the transmit buffer 218 out to the transmit path 206. The timing of transmission of read data by the data transmit circuit 226 is determined by what other data is being transmitted from upstream memory modules. The data transmit circuit 226 is informed (by the command decode and clock recovery logic 220) of how many packets are expected from upstream memory modules before data from data buffer 224 can be transmitted.

Figure 3:
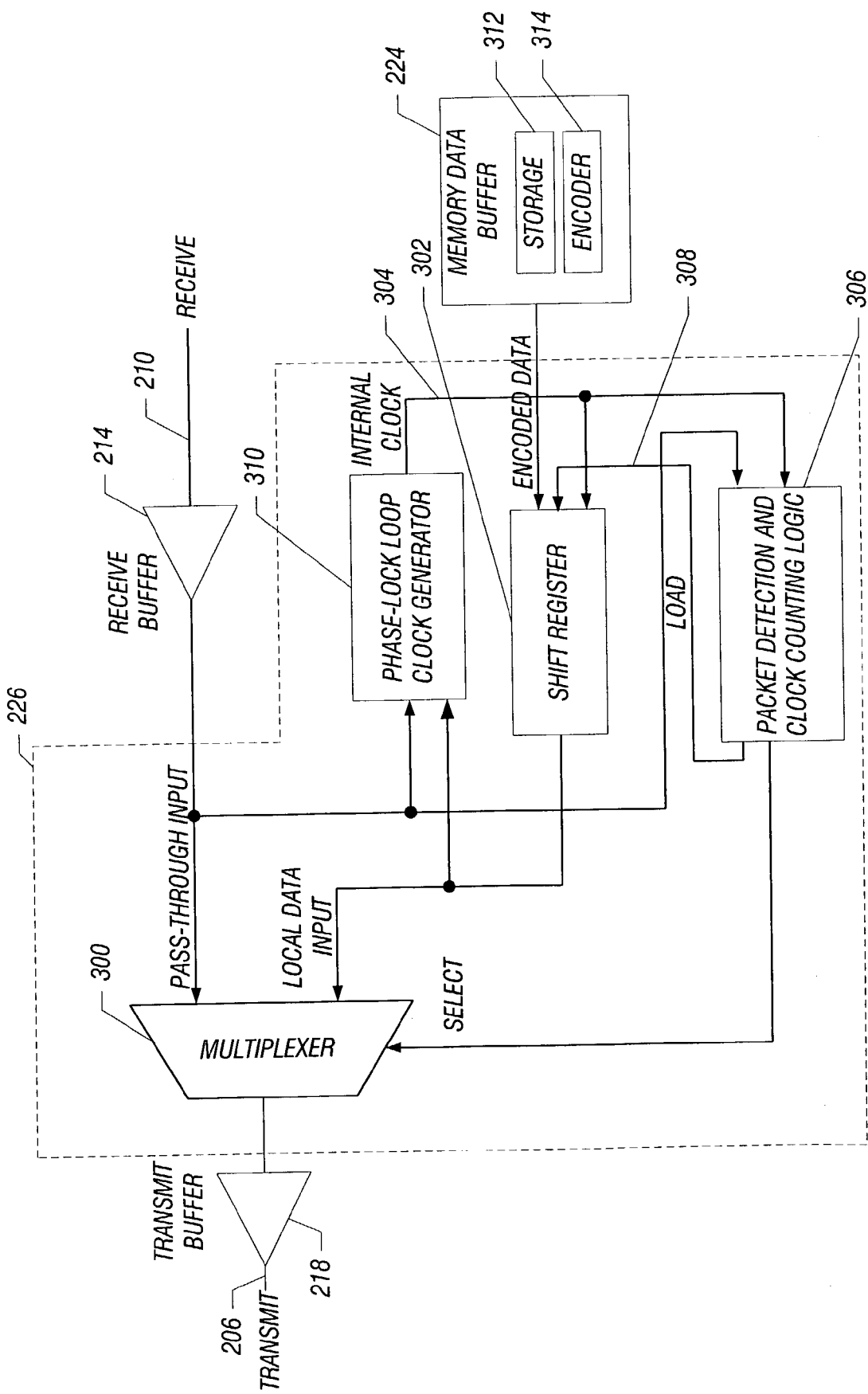
FIG. 3 is a block diagram of a data transmit circuit in the memory buffer circuit of FIG. 2.

FIG. 3 shows components of the data transmit circuit 226, according to one example implementation, along with receive and transmit buffers 214 and 216 and the memory data buffer 224. The data transmit circuit 226 includes a multiplexer 300 that selects between local data (through the local data input) or external data (through the pass-through input) of the multiplexer 300. The pass-through input of the multiplexer 300 receives data from the receive buffer 214, and passes the data through to the transmit buffer 218 for transmission over the transmit path 206. The local data input of the multiplexer 300 receives data from a shift register 302, which in turn receives encoded data from storage 312 in the data buffer 224. Encoding of data can be performed in one of many places. For example, as shown in FIG. 3, an encoder 314 can be provided in the data buffer 224 to perform the encoding of data received from the DRAM array 202. Alternatively, the encoder can be provided in the DRAM interface 222. The shift register 302 is clocked by an internal clock 304.

The shift register 302 converts data in the data buffer 224 into a serial stream of data to be output through the multiplexer 300 to the transmit path 206. A select input of the multiplexer 300 is controlled by the packet detection and clock counting logic 306. The packet detection and clock counting logic 306 also provides a load input 308 to the shift register 302 to load data from the data buffer 224 into the shift register 302. The packet detection and clock counting logic 306 is also clocked by the internal clock 304.

The internal clock 304 is generated by a clock generator 310, such as a PLL device. The phase and frequency of the internal clock 304 is locked with respect to the embedded clock in the data stream received over the receive path 210 in the downstream direction (similar to what is performed by the clock generator 221 (FIG. 2) in the upstream direction). Since the data stream is self-clocking, "fill" data is transmitted over the receive path 210 by one or more of the memory modules when there is no actual data to be sent. In the downstream path, fill data is generated by one or more of the memory modules. In the upstream path, the memory controller 104 generates and transmits the fill data. Fill data has one or more predefined values so that the memory controller 104 and memory modules can recognize a data stream as fill data.

In accordance with some embodiments of the invention, the memory subsystem 108 responds to commands from the memory controller 104 in a first-in-first-out sequence. Thus, for example, if a first command is received by the memory module 110D and a second, subsequent command is received by the memory module 100B, data from the memory module 110D is first transmitted back to the memory controller 104 before data from the memory module 110B is transmitted back to the memory controller 104. In other words, the memory buffer circuit 200 in the memory module 110B has to wait for data from the memory module 110D to finish transmission before the memory buffer circuit 200 in the memory module 110B can transmit data.

Since each memory buffer circuit 200 decodes commands intended for upstream memory modules, the memory buffer circuit 200 is aware of the number of packets to be transmitted from upstream memory modules. This information is provided by the command decode and clock recovery logic 220 to the packet detection and clock counting logic 306, which determines the number of packets that have been transmitted from upstream memory modules. In effect, the packet detection and clock counting logic 306 tracks packets from upstream memory modules so that it knows exactly on which clock the last packet from an upstream module will occur.

When the command decode and clock recovery logic 220 decodes a read command intended for an upstream memory module, the command decode and clock recovery logic 220 stores the read command so that the memory buffer circuit 200 is able to track the expected number of packets from the upstream memory module. The expected number of packets for the read command is communicated to the packet detection and clock counting logic 306. This is repeated for all other read commands. As a result, before the packet detection and clock counting logic 306 transmits local data, the packet detection and clock counting logic 306 first determines how many packets have been transmitted by upstream memory modules for read commands that precede the read command for which the local data is responsive. The local data is transmitted after the upstream memory modules have completed their respective transmissions.

The packet detection and clock counting logic 306 can perform the determination of the number of packets that have been transmitted. For example, the logic 306 can actually count how many packets are passed through the memory buffer circuit 200 by detecting for the first packet from a memory module, and then counting the number of clocks to determine how many packets have passed through the memory buffer circuit 200. Note that there may be fill data between packets the logic 306 only counts actual packets, not fill code characters.

At the appropriate time, the packet detection logic 306 switches the multiplexer 300 (with the select input of the multiplexer) from the pass-through input to the local data input so that data contained in the shift register 302 can be transmitted out to the transmit path 206. The packet detection logic switches the multiplexer to the local data input if one of the following conditions is satisfied: (1) there are no pending upstream read requests; or (2) there are pending upstream read requests but each such request does not precede (in time) the read request pending in the current memory module. Since the internal clock 304 is aligned so that the local data input to the multiplexer 300 switches at the same time as the pass-through data, there is no switching transition evident on the output of the multiplexer 300 except for some jitter specification. As a result, data from different memory modules can appear on the transmit path 206 without any gaps so that no clock phase shift or loss of bandwidth occurs.

In some cases, a narrow glitch on the output of the multiplexer 300 may result from clock skew and the clock-to-output propagation delay being slightly different between the data and select signals of the multiplexer 300. To address this glitch, the memory buffer circuit 200 can be designed so that both inputs to the multiplexer 300 are stable when the switch-over occurs between the pass-through input and the local data input.

To accomplish this, the shift register 302 can be loaded at least one clock before switch-over to the local data input, so that the local data input to the multiplexer 300 is stable during the switch-over. The pass-through input of the multiplexer 300 can be made stable during the switch-over from the pass-through input to the local data input by using a defined algorithm that employs several different fill code characters (transmitted by the memory modules in the downstream direction when there is no valid data to be sent). In one embodiment, the fill code characters include a normal fill code character and two special fill code characters. Normally, the normal fill code character is transmitted with the normal fill code character having the-same value for the first and last bits, which ensures that the pass-through input to the multiplexer 300 is stable if the switch-over is done on the boundary of two normal fill code characters.

Other scenarios employ the special fill code characters to avoid glitches. Each memory module that is transmitting read data (in response to a read command) keeps track of the next read command issued after the command the memory module is currently responding to. If the next read command was issued to a more downstream module, or if no other read command has been issued yet, then the data that the current memory module (referred to as the "first memory module") will receive after it completes sending its own data will be fill code (since the next read data will not be from a memory module that is more upstream than the first memory module).

At the completion of transmission of data by the first memory module through the local data input of the multiplexer 300, rather than switch immediately to the pass-through input of the multiplexer 300, the first memory module generates a special fill code character (one of two special fill code characters) for transmission immediately after transmission of the valid read data. The special fill code character has a first bit that matches the last bit of the read data that was just sent, and the last bit of the special fill code character matches the first bit of the first (normal) fill code character. This will provide a stable pass-through input at the multiplexer 300 at a downstream memory module (more downstream than the first memory module) that has to respond by transmitting read data after the first memory module has completed transmitting its read data. Thus, when the downstream memory module switches from the pass-through input to the local data input of the multiplexer 300 after the downstream memory module has detected that read data from the first memory module has completed transmission, the pass-through input of the multiplexer 300 in this downstream memory module is stable. To ensure that the special fill code character is received by downstream memory modules, any memory module that does not have its own data ready to send does not switch its multiplexer to the local data input until both the upstream packet and the immediately following fill code character (the special fill code character) has been retransmitted by the memory module.

In another scenario, if the next read command has been issued by a memory module that is upstream of the current memory module, then the switch-over to the pass-through input of the multiplexer 300 is done on the clock after the local data has completed transmitting, as usual. No special action needs to be taken in this case because a downstream memory module cannot insert its own data between two sequential upstream reads, and thus its multiplexer will not switch and thus no glitch avoidance provisions need to be made.

To provide a stable local data input to the multiplexer 300 when the multiplexer 300 switches in the other direction, from the local data input back to pass-through data, the shift register 302 simply holds the last data bit of the just transmitted data during the switch-over. To provide a stable pass-through input to the multiplexer 300, each memory module that is sending fill codes sends a special fill code character having a last bit that is the same as the first bit of the local data for the fill code character immediately preceding valid data.

As indicated above, according to one example, there are three fill code characters. The normal fill code character has the first and last bits with the same value, while the special fill code characters have different values for the first and last bits. In one arrangement, the fill code characters are selected to have as many alternating 1s and 0s as possible to minimize jitter accumulation.

As described above, much of the logic for performing tasks according to some embodiments of the invention is provided by hardware in the memory modules 110. Alternatively, the tasks can be performed by a combination of software or firmware and hardware. If the tasks are performed by software, then the software is stored as instructions and executed by one or more processing elements. The processing element includes a microprocessor, a microcontroller, a processor module or subsystem (including one or more microprocessors or microcontrollers), or other control or computing devices.

Data and instructions (of software) are stored in one or more machine-readable storage media. The storage media include different forms of memory including semiconductor memory devices such as dynamic or static random access memories (DRAMs or SRAMs), erasable and programmable read-only memories (EPROMs), electrically erasable and programmable read-only memories (EEPROMs) and flash memories; magnetic disks such as fixed, floppy and removable disks; other magnetic media including tape; and optical media such as compact disks (CDs) or digital video disks (DVDs).

While the invention has been disclosed with respect to a limited number of embodiments, those skilled in the art will appreciate numerous modifications and variations therefrom. It is intended that the appended claims cover such modifications and variations as fall within the true spirit and scope of the invention.

What is claimed is:

1. A system comprising:
a plurality of memory modules successively coupled by corresponding point-to-point links; and
a memory controller coupled to a first one of the memory modules by another point-to-point link,
the first one of the memory modules to track data transmitted by the other memory modules, wherein the first one of the memory modules include a clock generator to generate an internal clock based on a clock embedded in a data stream sent over one of the point-to-point links,
wherein transitions of data bits of the data stream are used as clock edges of the embedded clock.

2. The system of claim 1, the first one of the memory modules to transmit data to the memory controller after the first one of the memory modules has detected that data from the other memory modules has passed through the first one of the memory modules.

3. The system of claim 1, wherein the memory modules each includes an encoder to encode data sent over the point-to-point links to enable embedding of the clock in the data stream.

4. The system of claim 1, wherein the embedded clock is provided in a data path of the respective point-to-point link.

5. The system of claim 1, wherein the data stream is received in a first direction for communication to the memory controller, wherein each of the memory modules includes a second clock generator to generate a second clock based on a stream of information bits sent by the memory controller.

6. A system comprising:
a plurality of memory modules successively coupled by corresponding point-to-point links; and
a memory controller coupled to a first one of the memory modules by another point-to-point link,
the first one of the memory modules to track data transmitted by the other memory modules,
wherein at least one of the memory controller and memory modules is adapted to send fill data over at least one of the point-to-point links when there is no valid data to send over the at least one of the point-to-point links.

7. The system of claim 6, wherein the fill data contains one of plural values selected by the memory modules to prevent glitches.

8. A system comprising:
a plurality of memory modules successively coupled by corresponding point-to-point links; and
a memory controller coupled to a first one of the memory modules by another point-to-point link,
the first one of the memory modules to track data transmitted by the other memory modules,
wherein at least one of the memory controller and memory modules is adapted to send fill data when there is no valid data to send over the point-to-point links,
wherein the fill data contains one of plural values selected by the memory modules to prevent glitches,
the memory modules to select different ones of the plural values under different conditions.

9. A system comprising:
a plurality of memory modules successively coupled by corresponding point-to-point links; and
a memory controller coupled to a first one of the memory modules by another point-to-point link,
the first one of the memory modules to track data transmitted by the other memory modifies,
wherein the first one of the memory modules tracks data transmitted by upstream memory modules bank to the memory controller, the data transmitted by the upstream memory modules passing through one or more buffers in the first one of the memory modules,
wherein the first one of the memory modules comprises logic to determine a number of packets of the data transmitted by the upstream memory modules.

10. The system of claim 9, wherein the first one of the memory modules comprises a transmit circuit to determine when to transmit local data of the first one of the memory modules based on the determined number of packets.

11. A method for use in a system, comprising:
providing commands to memory modules coupled successively by point-to-point links; and
embedding a clock in each of the commands transmitted aver the point-to-point links to provide self-clocking of the commands,
wherein embedding the clock in each of the commands comprises using transitions of command bits in each of the commands as clock edges of the embedded clock.

12. The method of claim 11, further comprising passing the commands through a memory buffer circuit within one of the memory modules to another memory module.

13. The method of claim 12, further comprising generating an internal clock in the memory buffer circuit based on the embedded clock.

14. The method of claim 13, further comprising using the internal clock to control operation of the one memory module.

15. The method of claim 11, further comprising one of the memory modules transmitting data to a memory controller in response to a read command.

16. The method of claim 15, further comprising embedding a clock in a stream of the data.

17. The method of claim 16, further comprising:
generating a first internal clock in at least one of the memory modules from the clock embedded in each command,
generating a second internal clock in the at least one of the memory modules from the clock embedded in the stream of data.

18. A first memory module comprising:
a first buffer to receive commands from a memory controller;
a second buffer to receive data from a second memory module;
control logic to track data transmitted by the second memory module, and to control output of local data of the first memory module after to tracked data has passed through the first memory module; and
a transmit circuit to retransmit data from the second memory module and to output the local data,
wherein the control logic is adapted to count an amount of the tracked data passing through the transmit circuit.

19. The first memory module of claim 18, wherein the transmit circuit includes a multiplexer to select between the data from the second memory module and the local data for output.

20. The first memory module of claim 19, wherein the control logic is adapted to switch the multiplexer to output the local data after the tracked data has passed through the transmit circuit.

21. The first memory module of claim 18, wherein the control logic is adapted to control output of the local data on a clock immediately following a last clock carrying the tracked data.

22. A first memory module comprising:
a first buffer to receive commands from a memory controller;
a second buffer to receive data from a second memory module;
control logic to track data transmitted by the second memory module, and to control output of local data of the first memory module after the tracked data has passed through the first memory module; and a first clack generator to generate a first clock based on an embedded clock in the data transmitted by the second memory module, wherein transitions of data bits in the data are used as clock edges of the embedded clock.

23. The first memory module of claim 22, further comprising a second clock generator to generate a second clock based on an embedded clock in the commands from the memory controller.

24. The first memory module of claim 23, further comprising a memory interface to control access of data stored in a memory array in response to a command from the memory controller, the memory interface clocked by the second clock.

25. The first memory module of claim 24, further comprising a transmit circuit to transmit the local data, the transmit circuit clocked by the first clock.

26. The first memory module of claim 25, further comprising a shift register to serialize the local data.

27. The first memory module of claim 25, wherein the transmit circuit has a multiplexer wit a first input and a second input, the first input to select data from the second memory module to transmit from the transmit circuit, and the second input to select the local data to transmit from the transmit circuit.

28. A method for use in a system, comprising:

providing commands to memory modules coupled successively by point-to-point links; and embedding a clock in each of the commands transmitted over the point-to-point links to provide self-clocking of the commands;

one of the memory modules transmitting data to a memory controller in response to a read command; and embedding a clock in a stream of the data, wherein embedding the clock in the stream of the data comprises using transitions of data bits in the stream of the data as clock edges of the embedded clock in the stream of data.

29. A method for use in a system, comprising:

providing commands to memory modules coupled successively by point-to-point links; and embedding a clock in each of the commands transmitted over the point-to-point links to provide self-clocking of the commands; and one of the memory modules tracking data transmitted by another one of the memory modules by counting an amount of data transmitted by the another one of the memory modules.

* * * * *

UNITED STATES PATENT AND TRADEMARK OFFICE
CERTIFICATE OF CORRECTION

PATENT NO. : 7,020,757 B2 Page 1 of 1
APPLICATION NO. : 10/400371
DATED : March 28, 2006
INVENTOR(S) : Michael Ruhovets et al.

It is certified that error appears in the above-identified patent and that said Letters Patent is hereby corrected as shown below:

In column 6, line 9, delete "100B" and insert -- 110B --, therefor.

In column 9, line 1, in Claim 1, delete "include" and insert -- includes --, therefor.

In column 9, line 59, in Claim 9, delete "modifies," and insert -- modules, --, therefor.

In column 9, line 61, in Claim 9, delete "bank" and insert -- back --, therefor.

In column 10, line 9, in Claim 11, delete "aver" and insert -- over --, therefor.

In column 10, line 43, in Claim 18, delete "to" and insert -- the --, therefor.

In column 11, line 3, in Claim 22, delete "clack" and insert -- clock --, therefor.

In column 11, line 23, in Claim 27, delete "wit" and insert -- with --, therefor.

Signed and Sealed this

Twenty-sixth Day of May, 2009

JOHN DOLL
*Acting Director of the United States Patent and Trademark Office*